United States Patent
Wu et al.

(10) Patent No.: US 9,064,741 B1
(45) Date of Patent: Jun. 23, 2015

(54) UNIFORMITY IN WAFER PATTERNING USING FEEDBACK CONTROL

(71) Applicant: Taiwan Semiconductor Manufacturing Company, Ltd., Hsin-Chu (TW)

(72) Inventors: Chung-Hsi Wu, Ttaichung (TW); Han-Wen Liao, Taichung (TW); Chih-Yu Lin, Tainan (TW); Cherng-Chang Tsuei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/136,449

(22) Filed: Dec. 20, 2013

(51) Int. Cl.
*H01L 21/00* (2006.01)
*G01R 31/26* (2014.01)
*H01L 21/66* (2006.01)
*H01L 21/02* (2006.01)
*H01L 21/3213* (2006.01)
*H01L 21/683* (2006.01)

(52) U.S. Cl.
CPC .......... *H01L 22/12* (2013.01); *H01L 21/02019* (2013.01); *H01L 21/3213* (2013.01); *H01L 21/6831* (2013.01)

(58) Field of Classification Search
USPC ........................................................ 438/7, 16
See application file for complete search history.

(56) References Cited

U.S. PATENT DOCUMENTS

| | | | |
|---|---|---|---|
| 6,368,884 B1 * | 4/2002 | Goodwin et al. | 438/14 |
| 2002/0072003 A1 * | 6/2002 | Brill et al. | 430/30 |
| 2004/0110311 A1 * | 6/2004 | Flanner et al. | 438/10 |
| 2008/0233662 A1 * | 9/2008 | Shen et al. | 438/8 |
| 2013/0295698 A1 * | 11/2013 | Pforr et al. | 438/14 |

* cited by examiner

*Primary Examiner* — Karen Kusumakar
(74) *Attorney, Agent, or Firm* — Slater & Matsil, L.L.P (57) ABSTRACT

A method for patterning a wafer includes performing a first patterning on a wafer, and after performing the first patterning, calculating a simulated dose mapper (DoMa) map predicting a change in critical dimensions of the wafer due to performing a second patterning on the wafer. The method further includes performing the second patterning on the wafer. Performing the second patterning includes adjusting one or more etching parameters of the second patterning in accordance with differences between the simulated DoMa map and desired critical dimensions of the wafer.

20 Claims, 11 Drawing Sheets

UNIFORMITY IN WAFER PATTERNING USING FEEDBACK CONTROL

TECHNICAL FIELD

The present invention relates generally to wafer patterning, and, in particular embodiments, to improved uniformity in wafer patterning using feedback control.

BACKGROUND

In the manufacturing of integrated circuits, patterning techniques such as photolithography and etching are used to form various features such as polysilicon lines, devices (e.g., transistors, diodes, and the like), interconnect structures, contact pads, and the like in device dies on a wafer. As design features in integrated circuits become increasingly complex (e.g., having smaller critical dimensions and/or more complex shapes), double patterning processes may be used to form a single feature. However, due to process limitations, critical dimensions of the various patterned features may not be uniform within a device die/wafer, which may degrade the performance of the device die/wafer.

In order to improve critical dimension uniformity (CDU) and within wafer (WiW) uniformity, dose mapper (DoMa) maps may be calculated for wafers to measure the actual critical dimensions of patterned features. These DoMa maps may then be used to adjust lithography conditions of the patterning process to improve CDU and WiW uniformity. However, conventional DoMa maps and applications thereof may suffer from various limitations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Improved uniformity in wafer patterning using feedback control is provided in accordance with an embodiment. The intermediate stages of a process flow for an embodiment are illustrated. The variations of the embodiments are then discussed.

Embodiments will be described with respect to a specific context, namely patterning a polysilicon gate layer in a wafer using a double patterning process. Other embodiments may also be applied, however, to patterning other features in a wafer using a multiple pattern process.

Figure 1:
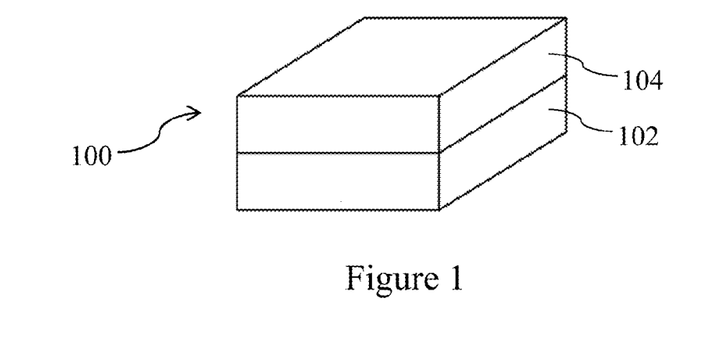
FIGS. 1 through 3 are perspective views of a first patterning of a first wafer in accordance with various embodiments.

FIGS. 1 through 8 illustrate the calculation of a dose mapper (DoMa) bias map 206 (see FIG. 8) to determine changes in critical dimensions of features in a first wafer 100 between a first patterning and a second patterning. FIG. 1 illustrates a portion of the first wafer 100 having a first device layer 102. In an embodiment, the first device layer 102 may be a polysilicon layer disposed over a substrate (not shown) for the formation of one or more polysilicon gates in first wafer 100. The substrate may be a bulk silicon substrate although other semiconductor materials including group III, group IV, and group V elements may also be used. Alternatively, the substrate may be a silicon-on-insulator (SOI) substrate.

In another embodiment, the first device layer 102 may be a metallization layer such as an inter-layer dielectric (ILD) or an inter-metal dielectric layer (IMD) for forming interconnect structures (e.g., metal lines and/or vias). In such embodiments, the first device layer 102 may be formed of low-k dielectric materials having k values, for example, lower than about 4.0 or even about 2.8. In yet other embodiments, the first device layer 102 may be any layer in the first wafer 100 that may be patterned using photolithography and etching processes.

Although FIG. 1 illustrates only one first device layer 102, the first wafer 100 may include numerous device layers. Furthermore, the first device layer 102 may include a buffer layer (e.g., an oxide interfacial layer, not shown), an etch stop layer (e.g., a silicon nitride layer, a silicon carbide layer, or the like), or the like. A first hard mask 104 may be formed over the first device layer 102 for use as a patterning mask. The first hard mask 104 may comprise an oxide, silicon oxynitride (SiON), silicon nitride ($Si_3N_4$), titanium nitride (TiN) or the like.

Figure 2:
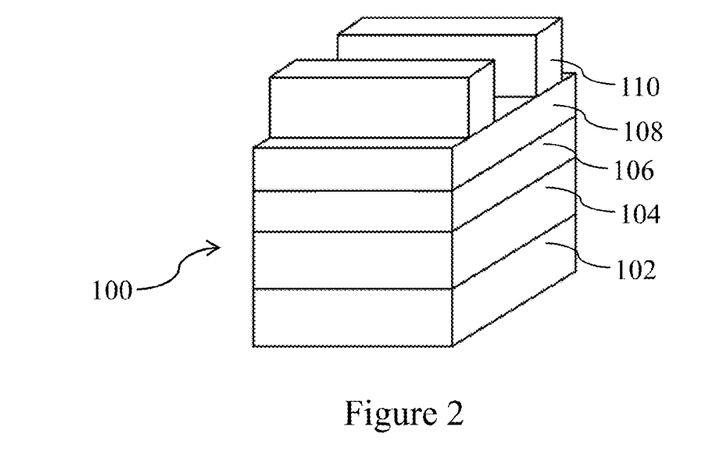

FIG. 2 illustrates the formation of an ashing-removable dielectric (ARD) 106 (e.g., comprising amorphous carbon, or the like), a bottom anti-reflective coating (BARC) 108, and a photoresist 110 over the first hard mask 104. The BARC 108 and the ARD 106 are formed to aid in the patterning of the first hard mask 104 with the photoresist 110. For example, the BARC 108 helps filter reflection from underlying layers during photolithography, and ARD 106 may be used for improved critical dimension uniformity, reduced line-edge roughness, and lower risk of defect during photolithography. The photolithography process used to pattern the photoresist 110 may include, for example, exposing portions of the photoresist 110 (e.g., using ultraviolet light) and removing the exposed or unexposed portion of the photoresist 110 depending on whether a positive or negative resist is used.

Figure 3:
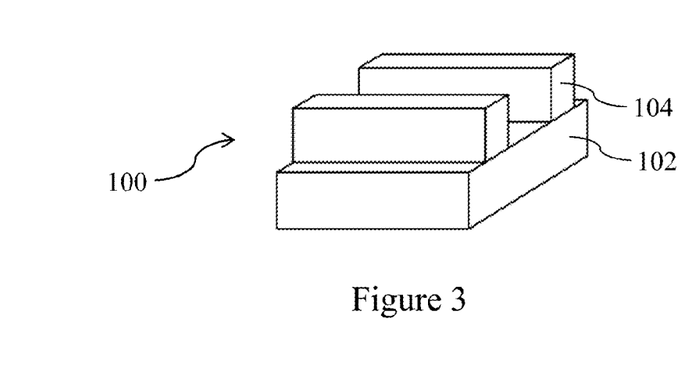

Next, as illustrated in FIG. 3, the first hard mask 104 is etched using the photoresist 110 as a patterning mask. The photoresist 110, the BARC 108, and first ARD 106 may then be removed, for example, using ashing and wet clean processes.

Figure 4:
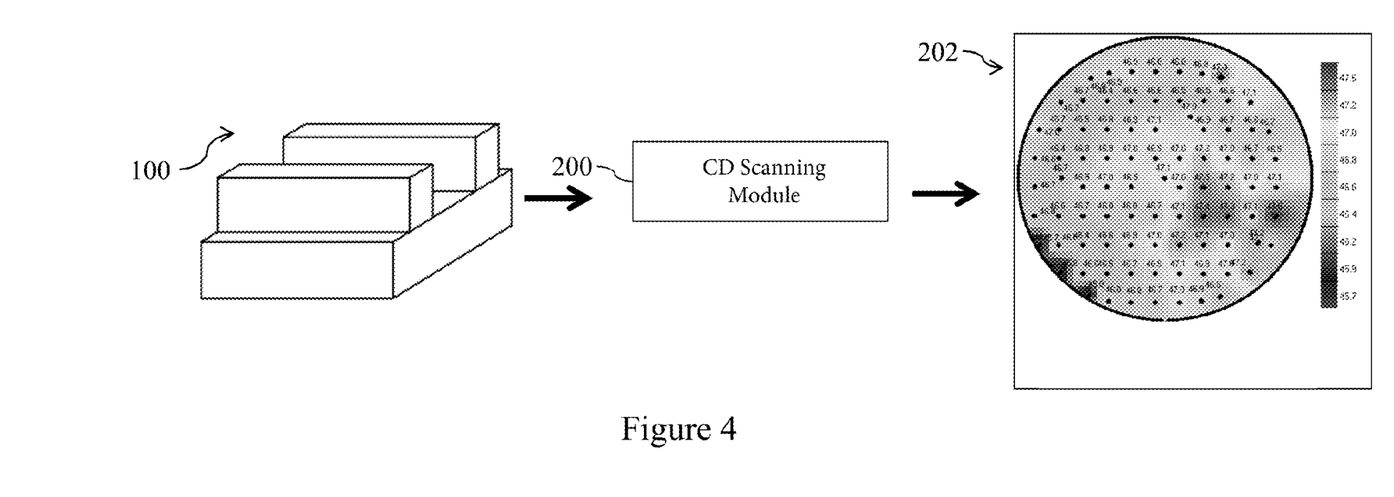
FIG. 4 is a process flow of calculating a dose mapper (DoMa) map for the first wafer after the first patterning in accordance with various embodiments.

FIG. 4 illustrates the first wafer 100 being then scanned by a critical dimension scanning module 200 to produce a first DoMa map 202. Critical dimension scanning module 200 may use critical dimension scanning electron microscopy (CDSEM) to measure critical dimensions (e.g., pitch, width of patterned features, spacing between patterned features, or the like) of test sites on various device dies across the first wafer 100. The number of test sites measured to produce a DoMa map such as the first DoMa map 202 may be quite large. For example, in various embodiments, the number of test sites may be five hundred or more. The first DoMa map 202 provides critical dimension measurements for features (e.g., the first hard mask 104) in different locations of the first wafer 100 after a first patterning process (illustrated in FIG. 3). Furthermore, the first DoMa map 202 may provide information related to critical dimension uniformity (CDU) such as mean, standard deviation, range, and the like. Although first DoMa map 202 includes specific measurements, one of ordinary skill in the art would recognize the actual measurements of the first DoMa map 202 (and any other DoMa map described herein) may vary.

Figure 5:
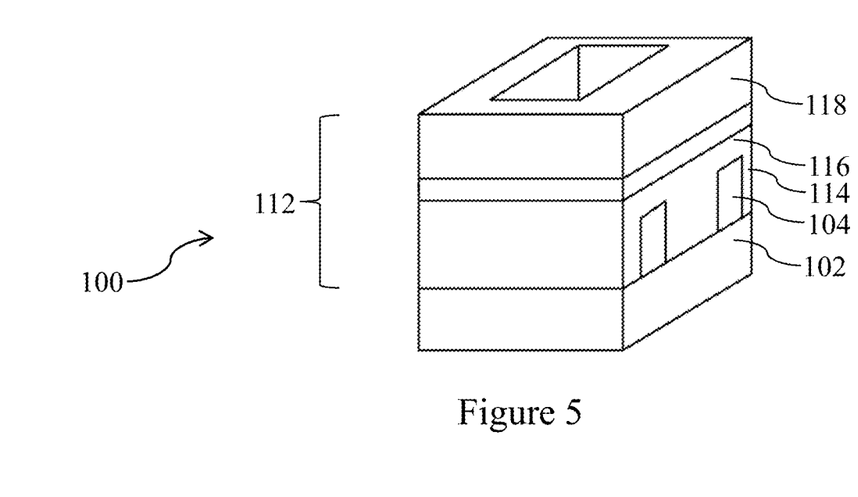
FIGS. 5 through 6 are perspective views of a second patterning of the first wafer in accordance with various embodiments.

In FIG. 5, a first tri-layer photoresist 112 is formed over the first hard mask 104 and the first device layer 102. The first tri-layer photoresist 112 includes a top photoresist layer 118, a middle layer 116, and a bottom layer 114. The middle layer 116 may include anti-reflective materials (e.g., an anti-reflective coating) to aid in exposure and focus during the processing of the top photoresist layer 118. The bottom layer 114 may comprise a hard mask material such as an ashable hard mask (e.g., amorphous carbon film or amorphous silicon film), polysilicon, or any other material that may be patterned and selectively removed without removing the first hard mask 104.

The top photoresist layer 118 may be patterned, for example, by exposing the top photoresist layer 118 and removing the exposed/unexposed portion. The patterning of top photoresist layer 118 forms a pattern in a different direction (e.g., orthogonal to) than the first patterning of the first hard mask 104 (illustrated in FIG. 3).

Figure 6:
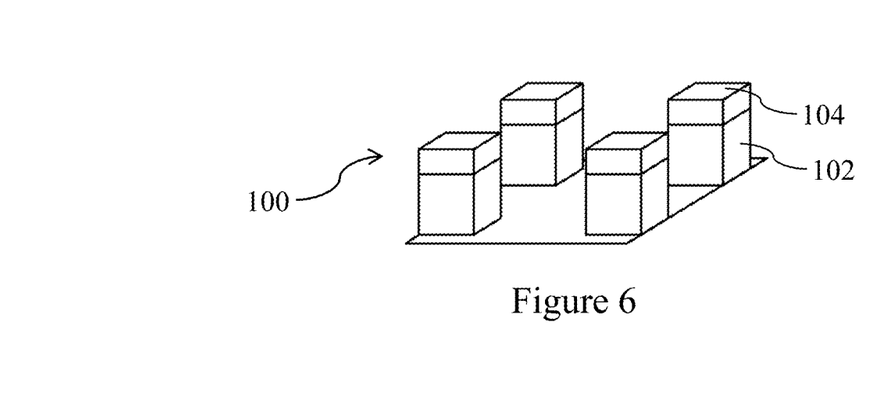

FIG. 6 illustrates the patterning of the first hard mask 104 and the first device layer 102 using the first tri-layer photoresist 112 has a mask. The pattern of the top photoresist layer 118 may be transferred to the middle layer 116, the bottom layer 114, and the first hard mask 104, for example, through etching. The first tri-layer photoresist 112 may be removed using, for example, ashing and wet cleaning processes. Subsequently, the first device layer 102 may be patterned using an etching process and the first hard mask layer 104 as a patterning mask. The etching process may be an anisotropic etching process, which may also thin the first hard mask 104.

As illustrated by FIGS. 1 through 6, the first device layer 102 is patterned using a double patterning process. Alternatively, in embodiments with less complex patterns (e.g., having a patterning running in a single direction), the first tri-layer photoresist 112 may be omitted. In such embodiments, the double patterning process may include patterning the first hard mask 104 (sometimes referred to as a pre-pattern) and using the first hard mask 104 as a patterning mask to etch the first device layer 102.

Figure 7:
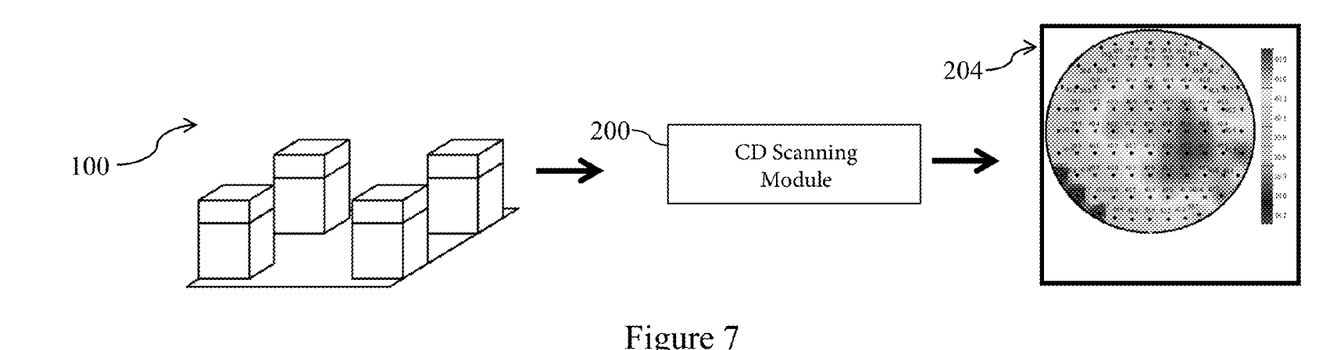
FIGS. 7 and 8 are process flows illustrating calculating a bias map for the first wafer after the second patterning in accordance with various embodiments.

The resulting first wafer 100 is scanned by the critical dimension scanning module 200 to produce a second DoMa map 204 as illustrated in FIG. 7. Critical dimension scanning module 200 may use CDSEM to scan and measure critical dimensions of patterned first hard mask 104 and first device layer 102. The second DoMa map 204 provides critical dimension measurements for features (e.g., the first hard mask 104) in different locations of the first wafer after the second patterning illustrated in FIG. 6. Generally, the second DoMa map 204 may be taking measurements of a same pattern as the first DoMa map 202, but the second DoMa map 204 measures the pattern after the second lithography process. For example, the first and second DoMa maps may both measure the pattern of the first hard mask 104 formed using the first lithography process (e.g., illustrated by FIG. 3). Furthermore, the second DoMa map 204 may provide information for gauging critical dimension uniformity (CDU) such as mean, standard deviation, range, and the like.

Figure 8:
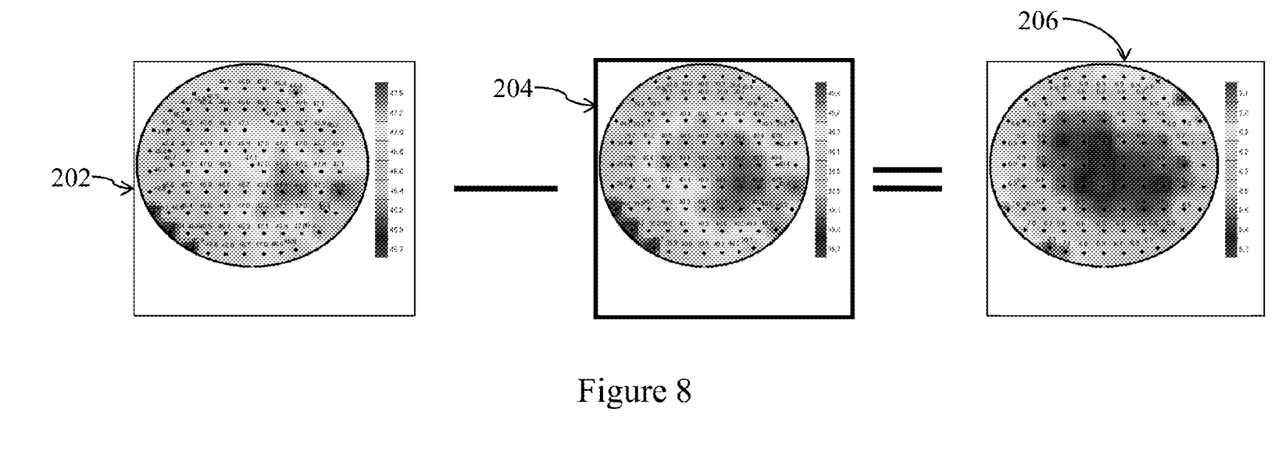

FIG. 8 illustrates the calculation of a DoMa bias map 206 in accordance with various embodiments. DoMa bias map 206 is calculated by taking the difference (e.g., by taking a point to point/site to site difference) between the first DoMa map 202 and the second DoMa map 204. Thus, the DoMa bias map 206 provides measurements of a change in critical dimensions of features in the first wafer 100 due to the second patterning process. The DoMa bias map 206 may be used in subsequent patterning processes to predict critical dimensions in a finished wafer based on a first patterning. In some embodiments, the accuracy of the DoMa bias map 206 may be checked by creating a simulated DoMa map of the second DoMa map 204 (e.g., by adding the DoMa bias map 206 to the first DOMa map 202) and checking offset and/or correlation values (e.g., a coefficient of determination value) between the simulated DoMa map and the actual values of the second DoMa map 204.

Figures 9, 10:
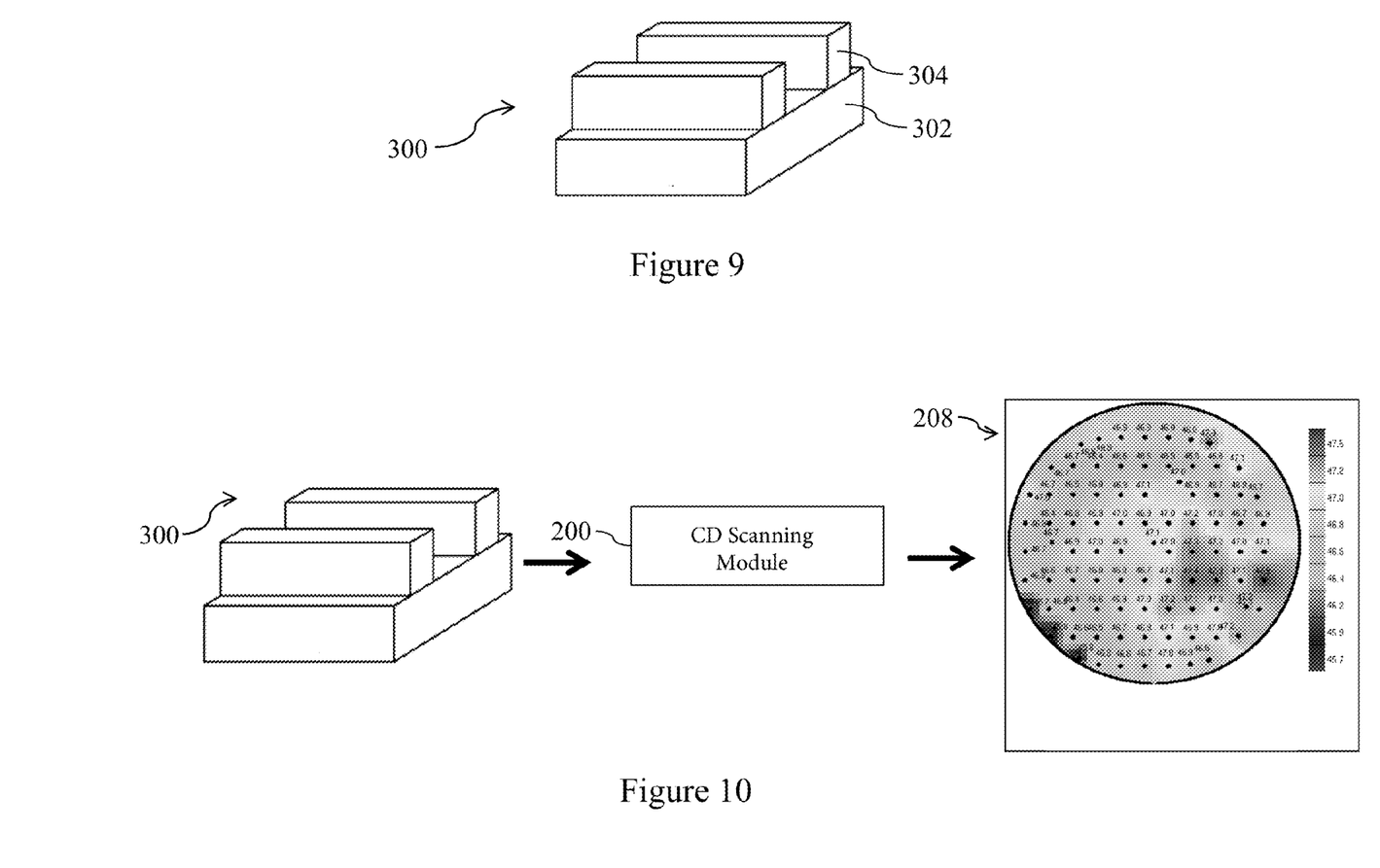
FIG. 9 is a perspective view of a first patterning of a second wafer in accordance with various embodiments.
FIG. 10 is a process flow of calculating a DoMa map for the second wafer after the first patterning in accordance with various embodiments.

FIGS. 9 through 17 illustrate the patterning of a second wafer 300 using the DoMa bias map 206 as feedback for improving CDU, within wafer (WiW) uniformity, wafer to wafer (W2W) uniformity, lot to lot (L2L, sometimes referred to run to run) uniformity, device performance uniformity (e.g., saturation current uniformity), and/or the like. FIG. 9 illustrates a perspective view of the second wafer 300. The second wafer 300 maybe substantially similar to the first wafer 100, and similar reference numerals indicate like features. For example, the second wafer 300 includes a second device layer 302 and a second hard mask 304, which may be substantially similar to the first device layer 102 and the first hard mask 104, respectively. As illustrated by FIG. 9, the second hard mask 304 may be patterned (e.g., using photolithography and etching) to have a same pattern as the first patterning of the first hard mask 104.

FIG. 10 illustrates the calculation of a third DoMa map 208 by measuring critical dimensions across the second wafer 300 using critical dimension scanning module 200. Critical dimension scanning module 200 may use CDSEM to scan and measure critical dimensions of test sites across the second wafer 300. These test sites may be located at the same location as the first wafer 100. Therefore, the third DoMa map 208 measures similar dimensions and locations as the first DoMa map 202.

Figure 11:
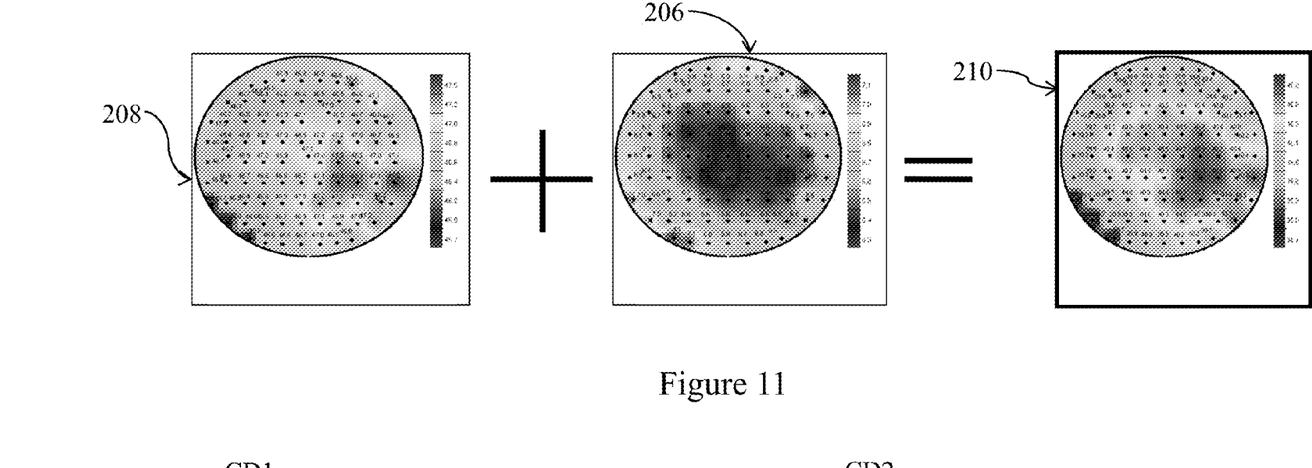
FIG. 11 is a process flow of calculating a simulated DoMa map for the second wafer after the first patterning in accordance with various embodiments.

In FIG. 11, a simulated DoMa map 210 is calculated by adding the third DoMa map 208 and the DoMa bias map 206. For example, the third DoMa map 208 and the DoMa bias map 206 may be added on a point-by-point basis for all points (e.g., within wafer and/or within field) on the third DoMa map 208 and the DoMa map 206. Alternatively, the third DoMa map 208 and the DoMa bias map 206 may be added on a point-by-point basis for as subset (e.g., any percentage) of measured points across the wafer. The simulated DoMa map 210 predicts the critical dimension of features in the second wafer 300 after a second patterning process based on the actual critical dimensions of the first patterning process and feedback from patterning a previous wafer (e.g., the DoMa bias map 206). Critical dimensions in the simulated DoMa map 210 may then be compared against target critical dimensions for the wafer (e.g., critical dimension set by the design of the wafer) to fine tune the first patterning of the second wafer 300 and/or to select process conditions for second patterning process of the second wafer 300.

Figure 12A:
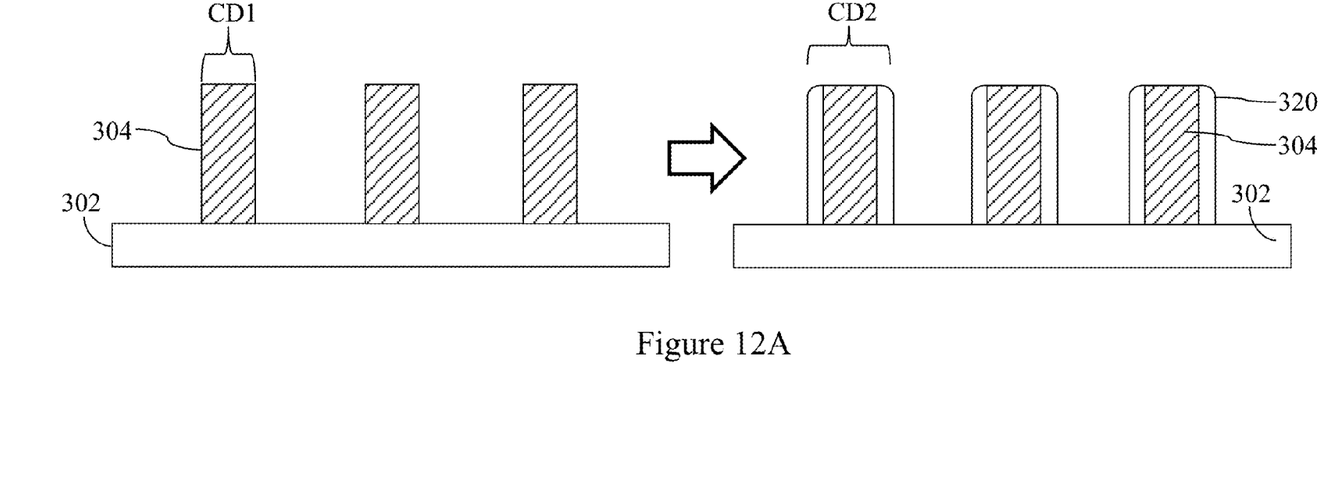
FIGS. 12A-12B illustrate fine tuning features of the second wafer in accordance with various embodiments.

For example, FIG. 12A illustrates an embodiment where the simulated DoMa map 210 indicated critical dimensions CD1 that were too small in the second wafer 300. In such embodiments, a coating layer 320 may be added to features (e.g., second hard mask 304) of the second wafer 300 to enlarge the relevant critical dimension CD1, to a more desirable critical dimension CD2. The coating layer 320 may be formed using any suitable deposition process, for example, using a process gas such as $SiCl_4$, $CH_4$, $SiO_2$, $SiH_x$, a polymer gas, or the like to form coating layer 320 sidewalls of the second hard mask 306. Other deposition methods may also be used.

Figure 12B:
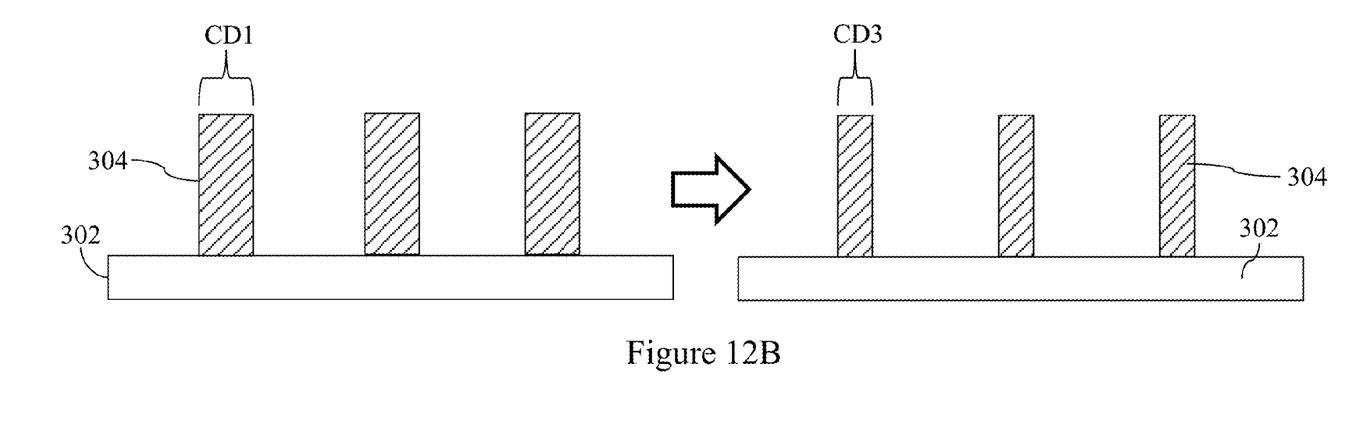

FIG. 12B illustrates an embodiment where the simulated DoMa map 210 indicated critical dimensions CD 1 that are too large in the second wafer 300. In such embodiments, a fine tuning etch process may be applied to the second hard mask 306 in the second wafer 300 to reduce the critical dimension CD1, to a more desirable critical dimension CD3. The expansion and reduction of features in the second wafer 300 may be performed in separate alternatives or in combination. For example, various features in portions of the second wafer 300 may be enlarged while other features in other portions of the second wafer 300 may be reduced to achieve desired critical dimensions. Although FIGS. 12A and 12B illustrate changing critical dimensions of the second hard mask 306, various embodiments may include fine tuning critical dimensions of other features in the second wafer 300 such as the spacing between the second hard mask 306, and/or the like. Furthermore, critical dimensions may be fine-tuned across the entirety of the second wafer 300 or a portion of the second wafer 300.

Figure 13:
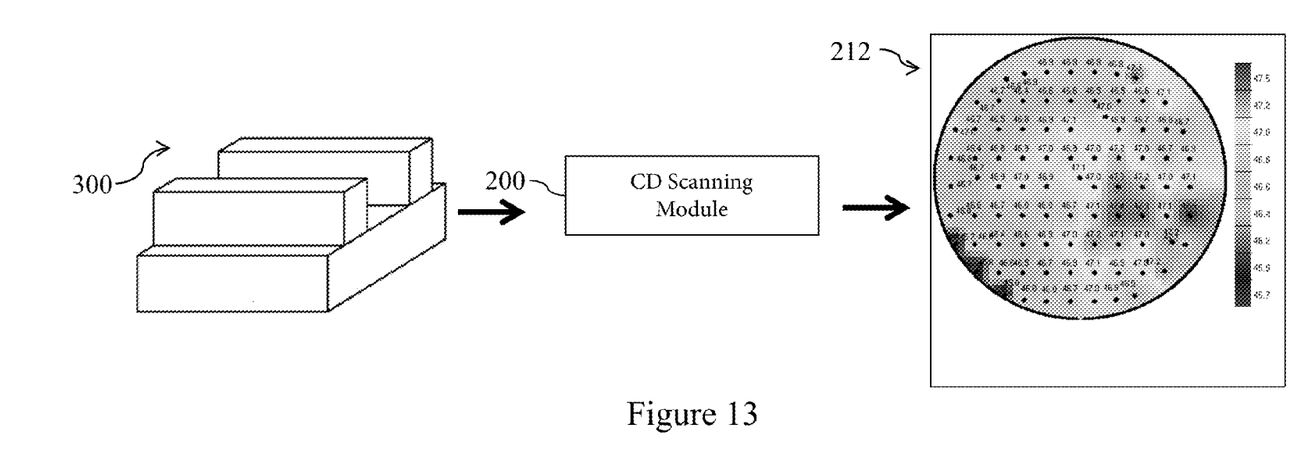
FIG. 13 is a process flow of calculating a DoMa map for the second wafer after fine tuning in accordance with various embodiments.

In FIG. 13, a fourth DoMa map 212 may be optionally calculated by measuring critical dimensions across the second wafer 300 after fine tuning using critical dimension scanning module 200 (e.g., by using CDSEM to scan and measure critical dimensions of test sites across the second wafer 300). The fourth DoMa map 212 provides critical dimension information of the second wafer 300 after fine tuning of the first patterning based on the simulated DoMa map 210. In subsequent process steps, the fourth DoMa map 212 may be used to update the DoMa bias map 206 for patterning subsequent wafers.

Figure 14:
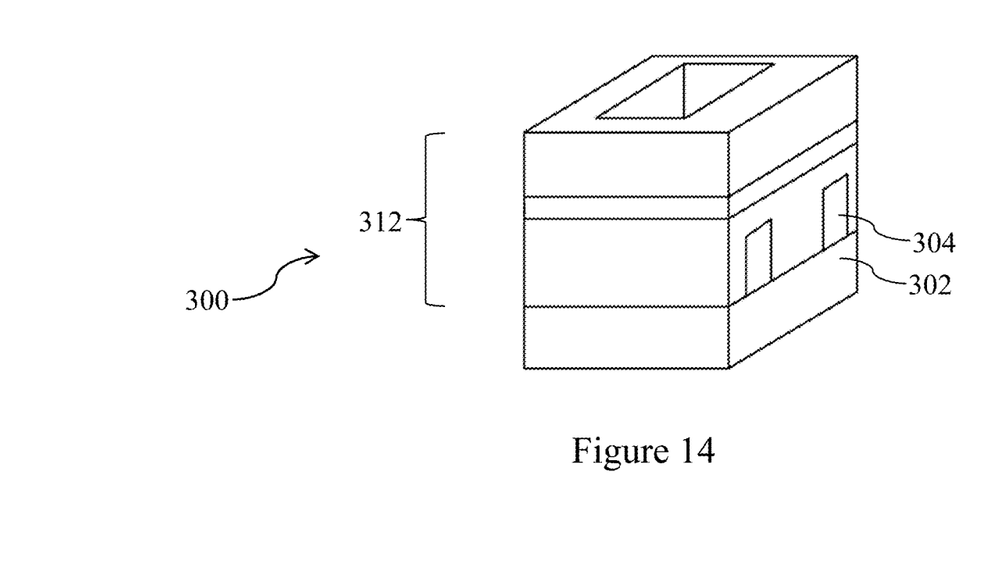
FIG. 14 is a perspective view of forming a tri-layer photoresist over the second wafer in accordance with various embodiments.

FIG. 14 illustrates the formation of a second tri-layer photoresist 312 over the second hard mask 304 and the second device layer 302. The second tri-layer photoresist 312 may be substantially similar to the first tri-layer photoresist 112 and may include a top photoresist layer, a middle layer, and a bottom layer. In various embodiments, the simulated DoMa map 210 may be used to adjust photolithography conditions for patterning the second tri-layer photoresist 312. Generally, the critical dimensions of a pattern have a linear relationship with strength of the exposure dosage during photolithography. Thus, by adjusting the exposure dosage used to pattern the second tri-layer photoresist 312, critical dimensions of the patterned photoresist may be adjusted to compensate for differences between the simulated DoMa map 210 and desired critical dimensions of the second wafer 300.

Figure 15A:
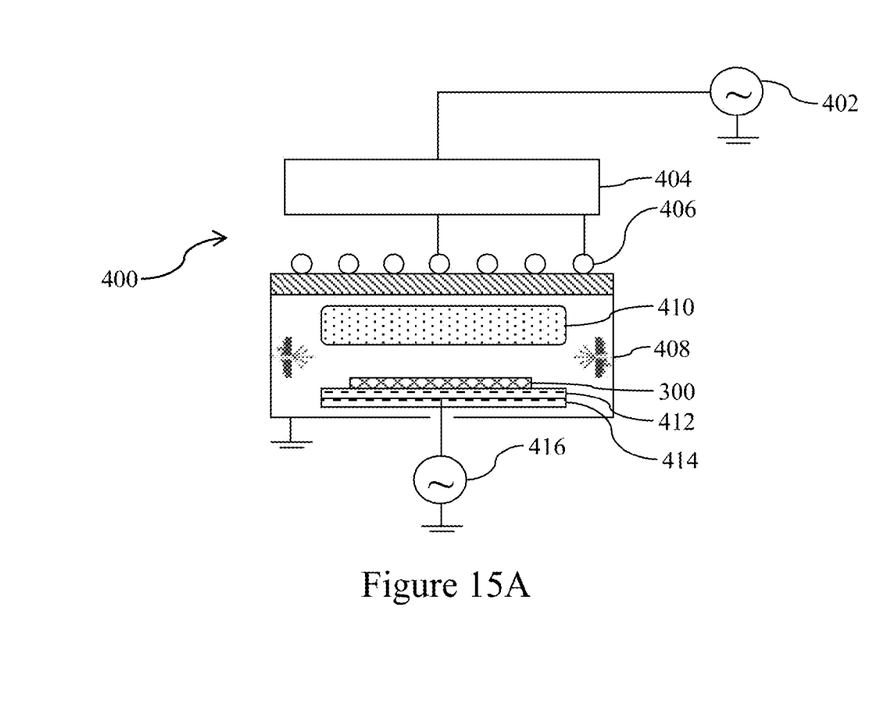
FIGS. 15A and 15B illustrate portions of an etching chamber which may be used to etch the second wafer in accordance with various embodiments.

FIG. 15 illustrates an etching chamber 400 for etching the second hard mask 304 and the second device layer 302 using the second tri-layer photoresist 312 as a patterning mask. The etching chamber 400 includes a radio frequency (RF) power generator 402, a power controller 404, RF coils 406, a tunable gas injector 408, a top electrode 410, a tunable electrostatic chuck (ESC) 412, a temperature control module 414, and a ESC power generator 416. The power controller 404 helps stabilize and control a power level supplied by the RF power generator 402 to RF coils 406. Alternatively RF power generator 402 may be replaced with a different power source such as a microwave power source or any applicable plasma/radical generated power source. The RF power generator 402, the RF coils 406, the top electrode 410, and the tunable ESC 412 generates an RF electromagnetic field while the tunable gas injector 408 supplies a process gas (e.g., a fluorocarbon) into the etching chamber 400. The second wafer 300 may be placed on the tunable electrostatic chuck (ESC) 412. The RF electromagnetic field converts the process gas between the top electrode 410 and the tunable ESC 412 into plasma for etching the second wafer 300. Other configurations of etching chamber 400 may also be used.

Differences between the simulated DoMa map 210 and desired critical dimensions of the second wafer 300 may be used to adjust the process conditions of etching chamber 400. For example, the tunable gas injector 408 may control gas flow speed and distribution location of gas flow into the etching chamber 400. Generally, increased gas flow speed increases etching times and the amount of material removed. The tunable gas injector 408 may control the gas flow speed over different areas the second wafer 300 during etching to achieve desired critical dimensions. For example, the simulated DoMa map may indicate critical dimensions that are too large in a section of the second wafer 300, and the tunable gas injector 408 may alter the gas flow to the section accordingly.

Figure 15B:
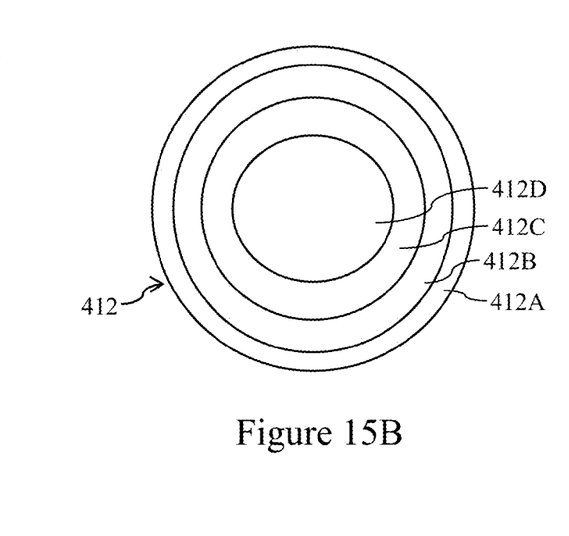

As another example, the bias power (e.g., using ESC power generator 416) and/or the temperature (e.g., using temperature control module 414) may be adjusted based on differences between the simulated DoMa map 210 and desired critical dimensions. Generally, a higher bias power and a higher temperature increase the etching rate and amount etched, whereas a lower bias power and a lower temperature decrease the etching rate and the amount etched. The ESC power generator 416 may be used to adjust the bias power applied to the tunable ESC 412 during etching to achieve desired critical dimensions. The temperature control module 414 may adjust the temperature of the tunable ESC 412, for example, by partitioning the tunable ESC 412 into different zones (e.g., inner zone 412A, middle zone 412B, intermediate zone 412C, and outer zone 412D of FIG. 15B) and heating and/or cooling the different zones to increase/decrease etch rates and adjust the critical dimensions of the second wafer 300. Although FIG. 15B illustrates tunable ESC 412 as having four zones, the tunable ESC 412 may have any number of zones in other embodiments.

Thus, by adjusting the etching chamber parameters (e.g., gas flow rate, gas flow distribution, temperature of the ESC 412, and/or the bias power of the ESC 412) allows for different critical dimensions to be formed during etching. These etching chamber parameters may be adjusted in accordance with differences between the simulated DoMa map 210 and desired critical dimensions to improve CDU, WiW uniformity, L2L uniformity, and the like.

Figure 16:
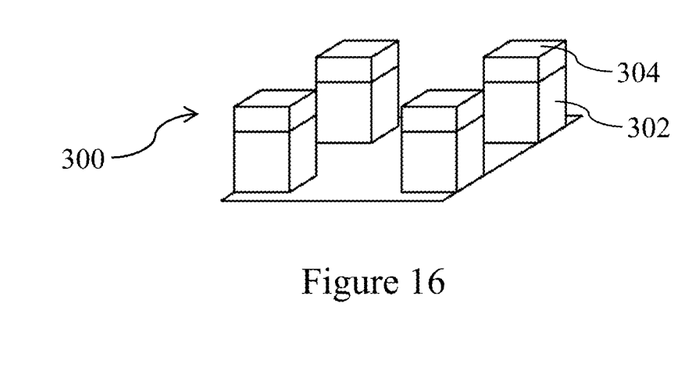
FIG. 16 is a perspective view of the second wafer after a second patterning in accordance with various embodiments.

FIG. 16 illustrates a perspective view of the resulting second wafer 300 after a second patterning process using the second tri-layer photoresist 312 as a patterning mask and adjusted etching parameters. The second tri-layer photoresist may then be removed. The resulting second wafer 300 may have improved CDU, WiW uniformity, or the like due to the use of the simulated DoMa map 210 to fine tune the first patterning of the second wafer 300 (illustrated in FIGS. 10A and 10B), adjust lithography conditions (e.g., exposure dosage) of the second patterning process (illustrated in FIG. 14), and/or adjust the etching parameters (e.g., controlling gas flow rate, gas flow distribution, temperature, and/or bias power) of the second patterning (illustrated in FIG. 15).

Figure 17:
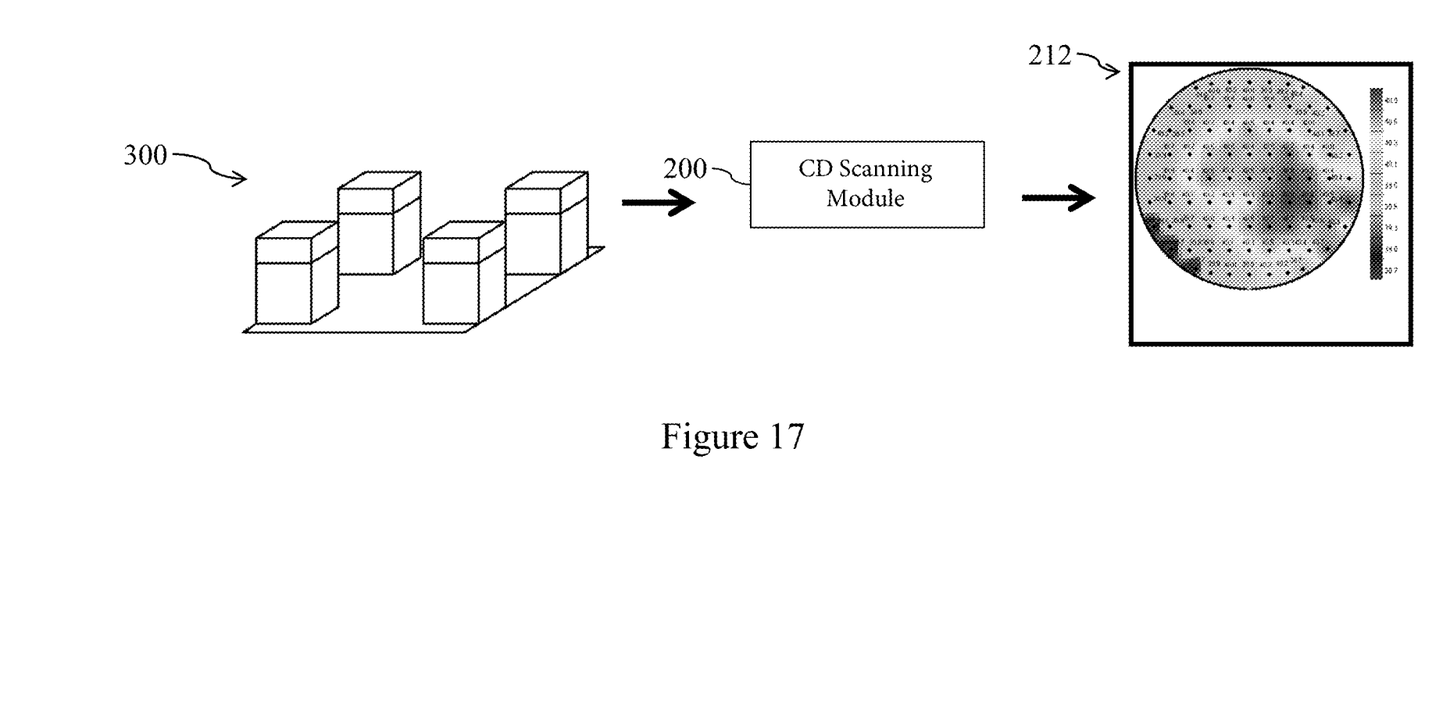
FIG. 17 is a process flow for calculating a DoMa map for the second wafer after the second patterning in accordance with various embodiments.

Subsequently, as illustrated by FIG. 17, a fifth DoMa map 214 may be calculated by the critical dimension scanning module 200 to include critical dimensions of the patterned second wafer 300. The fifth DoMa map 214 map may be used to update the bias map 206 to improve the accuracy of simulated DoMa maps in subsequent patternings. For example the fifth DoMa map 214 map may be compared to a desired DoMa map (e.g., having desired critical dimensions based on the design of wafers 100 and 300). Any differences between the fifth DoMa map 214 and the desired DoMa map may be used to update the bias map 206, for example, by adding calculated differences to the bias map 206 on a point-by-point basis for all points or a subset of points (e.g., between 0% and 100% of points). In another embodiment, differences between the fifth DoMa map 214 and the fourth DoMa map 212 (please refer to FIG. 13) are calculated to form a second bias map. The bias map 206 may be updated using the second bias map (e.g., the bias maps may be averaged) for generating more robust simulated DoMa maps.

Thus, various embodiments calculate a bias map from a first double patterning process of a first wafer. The bias map may be used to improve critical dimensions of other subsequent wafers during patterning. For example, the bias map may be used to calculate a simulated DoMa map for each wafer after a first patterning. This simulated DoMa map may be compared against desired critical dimensions for fine tuning a first patterning, adjusting lithography conditions, and/or adjusting etching conditions during a second patterning. Thus, through feedback, CDU, WiW uniformity, L2L uniformity, and the like may be improved. After each wafer is patterned, a DoMa map may be calculated to update the bias map.

Furthermore, while critical dimension scanning module 200 is only discussed as being used to generate DoMa maps, in various embodiments critical dimension scanning module 200 may be used to measure sample critical dimensions after any patterning step (e.g., after lithography and/or etching step) for feedback control. For example, the CD scanning module may measure about a dozen test sites in the wafer after a patterning step using CDSEM and/or optical spectrum measurements. These select CD measurements may then be fed back to the patterning device (e.g., the lithography device and/or etching chamber 400) to adjust patterning process conditions of a subsequent wafer.

Figure 18:
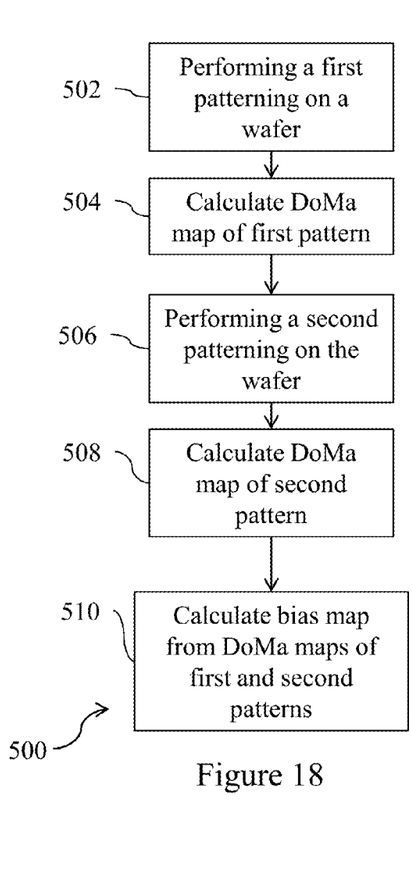
FIG. 18 is a process flow for calculating a bias map in accordance with various embodiments.

FIG. 18 illustrates a process flow 500 for calculating a bias map in accordance with various embodiments. In step 502, a wafer (e.g., first wafer 100) is patterned with a first patterning process, for example, using photolithography and etching. In step 504, a DoMa map of the first pattern is generated for the wafer. The DoMa map of the first pattern may be generated by a critical dimension scanning module using CDESM to measure test sites on device dies in the wafer. The number of test sites may be quite large (e.g., five hundred or more), and the DoMa map may be able to generate accurate and location-specific critical dimension measurements of the features of the wafer after the first patterning.

Next, in step 506, a second patterning process is performed on the wafer. The second patterning process may include photolithography and etching to create more complex patterns (e.g., running a different direction than the first pattern). Alternatively, the second patterning process may be an etching process, for example, to transfer a hard mask patterned in the first patterning process to an underlying device layer. In step 508, a DoMa map of the second pattern is generated for the wafer, for example, using a critical dimension scanning module and CDESM. The DoMa map of the second patterning process provides location-specific critical dimension measurements of features of the wafer after the second patterning.

In step 510, the bias map is calculated from the DoMa maps of the first and second patterns. For example, the bias map may be calculated by taking a difference of the DoMa maps. Thus, the bias map is a DoMa map that measures a change in critical dimensions in the wafer between the first and second patterning processes.

Figure 19:
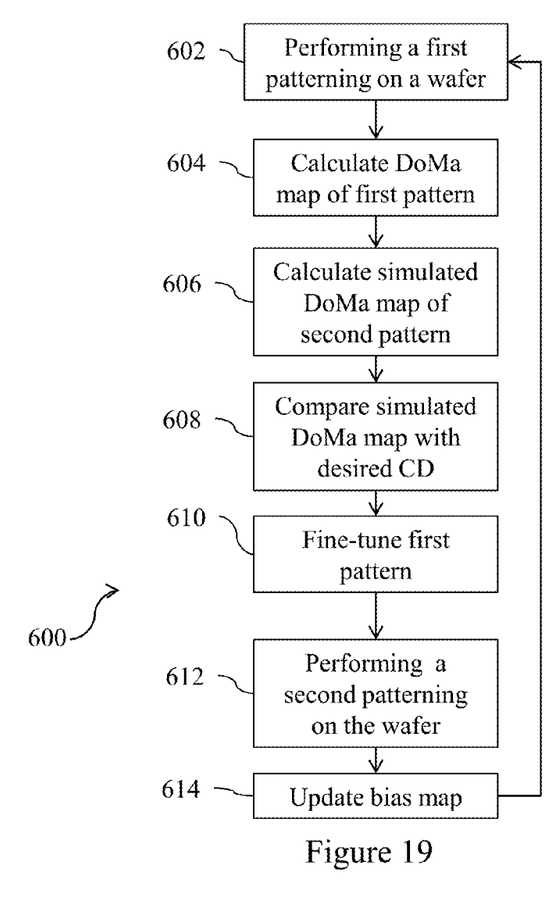
FIG. 19 is a process flow for patterning a wafer using feedback control in accordance with various embodiments Corresponding numerals and symbols in the different figures generally refer to corresponding parts unless otherwise indicated. The figures are drawn to clearly illustrate the relevant aspects of the embodiments and are not necessarily drawn to scale.

FIG. 19 illustrates a process flow 600 for calculating a bias map in accordance with various embodiments. In step 602, a wafer (e.g., second wafer 300) is patterned with a first patterning process, for example, using photolithography and etching. In step 604, a DoMa map of the first pattern is generated for the wafer. The DoMa map of the first pattern may be generated by a critical dimension scanning module using CDESM to measure test sites on device dies in the wafer. The number of test sites may be quite large (e.g., five hundred or more), and the DoMa map may be able to generate accurate and location-specific critical dimension measurements of the features of the wafer after the first patterning.

In step 606, a simulated DoMa map of a second pattern is calculated. The simulated DoMa map may be calculated by adding the DoMap map of the first pattern to a bias map. The bias map may be calculated from patterning a previous wafer, for example, using the process illustrated by FIG. 18. The bias map may provide measurements of changes in critical dimensions in the previous wafer between a first and a second patterning process. The simulated DoMa map predicts critical dimensions of the wafer after a second patterning based on critical dimensions of wafer after the first patterning and the bias map.

Next, in step 608, the simulated DoMa map is compared to a desired DoMa map. The desired DoMa map may include desired critical dimensions of the wafer based on the design of the wafer. Based on differences between the simulated DoMa map and the desired DoMa map, steps 610 and 612 may be performed to improve CDU, WiW uniformity, and the like. For example, in step 610, the first pattern may be fine-tuned by expanding/contracting certain features in the wafer. Expanding features in the wafer may be performed by depositing a coating layer on the features while contracting features in the wafer may be performed by performing additional etching. In step 612, a second patterning is performed on the wafer. The second patterning process may include a combination of photolithography and etching. In an embodiment, lithography process conditions for the second patterning may be adjusted to achieve desired critical dimensions, for example, by adjusting the exposure dosage. In another embodiment, etching process parameters for the second patterning may be adjusted. For example, gas flow rate, gas flow distribution, temperature, and/or bias power of the second etching process may be adapted to achieve desired critical dimensions. One of ordinary skill in the art would recognize that fine-tuning the first pattern, adjusting lithography conditions, and adjusting etching parameters may be performed individually or in combination based on differences between the simulated DoMa map and the desired DoMa map.

In step 614, the bias map may be updated. For example, a DoMa map of the second pattern may be generated for the wafer. A new bias map for the wafer may be generated from the DoMa map of the second pattern and a DoMa map calculated after fine tuning the first pattern (step 610). The two bias maps may then be averaged. In an alternative embodiment, the DoMa map of the second pattern may be compared with the desired DoMa map, and any differences may be used to update the bias map. Then, the process may be repeated from step 602 to pattern a subsequent wafer using the updated bias map.

In accordance with an embodiment, a method for patterning a wafer includes performing a first patterning on a wafer, and after performing the first patterning, calculating a simulated dose mapper (DoMa) map predicting a change in critical dimensions of the wafer due to performing a second patterning on the wafer. The method further includes performing the second patterning on the wafer. Performing the second patterning includes adjusting one or more etching parameters of the second patterning in accordance with differences between the simulated DoMa map and desired critical dimensions of the wafer.

In accordance with another embodiment, a method for patterning a wafer includes performing a first patterning on a first wafer, calculating a first dose mapper (DoMa) map measuring critical dimensions of the first wafer as a result of the first patterning, and calculating a simulated DoMa map using the first DoMa map and a bias map. The bias map is calculated based on performing the first patterning and performing a second patterning on a second wafer. The method further includes fine-tuning the first patterning of the first wafer based on a difference between the simulated DoMa map and desired critical dimensions of the first wafer.

In accordance with yet another embodiment, a method for patterning a wafer includes patterning a first pattern on a first wafer and calculating a first dose mapper (DoMa) map measuring critical dimensions of the first pattern on the first wafer. A second pattern is patterned on the first wafer, and a second DoMa map measuring critical dimensions of the second pattern on the first wafer is calculated. A bias map is calculated by taking a difference between the first DoMa map and the second DoMa map. The method further includes patterning the first pattern on a second wafer, and calculating a third DoMa map measuring critical dimensions of the first pattern on the second wafer. A simulated DoMa map is calculated by adding the third DoMa map and the bias map. The simulated DoMa map is compared with a desired DoMa map. The desired DoMa map includes desired critical dimensions of the second wafer. One or more patterning processes of the second wafer are adjusted. The one or more patterning processes include at least one of fine tuning the first pattern on the second wafer, and adjusting etching parameters for patterning the second pattern on the second wafer. The second pattern is patterned on the second wafer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for patterning a wafer comprising:
   performing a first patterning on a first wafer;
   after performing the first patterning, calculating a simulated dose mapper (DoMa) map predicting a change in critical dimensions of the first wafer due to performing a second patterning on the first wafer; and
   performing the second patterning on the first wafer, wherein performing the second patterning comprises adjusting one or more etching parameters of the second patterning in accordance with differences between the simulated DoMa map and desired critical dimensions of the first wafer.

2. The method of claim 1, wherein calculating the simulated DoMa map comprises: calculating a first DoMa map measuring the critical dimensions of the first wafer from performing the first patterning and adding the first DoMa map to a bias map.

3. The method of claim 2, further comprising calculating the bias map by taking a difference between a second DoMa map and a third DoMa map, wherein the second DoMa map measures critical dimensions of a second wafer from performing the first patterning on the second wafer, and wherein the third DoMa map measures the critical dimensions of the second wafer from performing the second patterning on the second wafer.

4. The method of claim 1, wherein the one or more etching parameters comprises a temperature of an electrostatic chuck (ESC) used during the second patterning, bias power applied to the ESC, gas flow speed into an etching chamber used during the second patterning, gas flow distribution in the etching chamber, or a combination thereof.

5. The method of claim 1, further comprising before performing the second patterning, fine tuning the first patterning of the first wafer in accordance with the differences between the simulated DoMa map and the desired critical dimensions of the first wafer.

6. The method of claim 1, wherein performing the second patterning comprises performing a photolithography process, and adjusting an exposure dosage of the photolithography process in accordance with the difference between the simulated DoMa map and the desired critical dimensions of the first wafer.

7. A method for patterning a wafer comprising:
   performing a first patterning on a first wafer;
   calculating a first dose mapper (DoMa) map measuring critical dimensions of the first wafer as a result of the first patterning;
   calculating a simulated DoMa map using the first DoMa map and a bias map, wherein the bias map is calculated based on performing the first patterning and performing a second patterning on a second wafer; and
   fine-tuning the first patterning of the first wafer based on a difference between the simulated DoMa map and desired critical dimensions of the first wafer.

8. The method of claim 7, further comprising after fine-tuning the first patterning, performing the second patterning on the first wafer.

9. The method of claim 7, wherein calculating the first DoMa map comprises using critical dimension scanning electron microscopy.

10. The method of claim 8, wherein the second patterning comprises an etching process, and wherein the method further comprises adjusting the etching process based on the difference between the simulated DoMa map and the desired critical dimensions of the first wafer.

11. The method of claim 8, wherein the second patterning comprises a photolithography process, and wherein the method further comprises adjusting an exposure dosage of the photolithography process based on the difference between the simulated DoMa map and the desired critical dimensions of the first wafer.

12. The method of claim 8, further comprising calculating a second DoMa map measuring critical dimensions of the first wafer as a result of the second patterning, and updating the bias map using the second DoMa map.

13. The method of claim 12, further comprising calculating a third DoMa map measuring critical dimensions of the first wafer as a result of the fine-tuning, wherein updating the bias map comprises averaging the bias map with a difference taken between the second DoMa map and the third DoMa map.

14. The method of claim 12, wherein updating the bias map comprises using a difference taken between the second DoMa map and the desired critical dimensions of the first wafer.

15. The method of claim 7, further comprising:
performing the first patterning on the second wafer;
calculating a fourth DoMa map measuring critical dimensions of the second wafer as a result of the first patterning;
performing the second patterning on the second wafer;
calculating a fifth DoMa map measuring critical dimensions of the second wafer as a result of the second patterning; and
calculating the bias map by taking a difference between the fourth DoMa map and the fifth DoMa map.

16. The method of claim 7, wherein fine-tuning the first patterning comprises depositing a coating layer on one or more features of the first wafer.

17. The method of claim 7, wherein fine-tuning the first patterning comprises removing portions of one or more features of the first wafer.

18. A method for patterning a wafer comprising:
patterning a first pattern on a first wafer;
calculating a first dose mapper (DoMa) map measuring critical dimensions of the first pattern on the first wafer;
patterning a second pattern on the first wafer;
calculating a second DoMa map measuring critical dimensions of the second pattern on the first wafer;
calculating a bias map by taking a difference between the first DoMa map and the second DoMa map;
patterning the first pattern on a second wafer;
calculating a third DoMa map measuring critical dimensions of the first pattern on the second wafer;
calculating a simulated DoMa map by adding the third DoMa map and the bias map;
comparing the simulated DoMa map with a desired DoMa map, wherein the desired DoMa map includes desired critical dimensions of the second wafer;
adjusting one or more patterning processes of the second wafer, wherein adjusting the one or more patterning processes of the second wafer comprises at least one of:
fine tuning the first pattern on the second wafer; and
adjusting etching parameters for patterning the second pattern on the second wafer; and
patterning the second pattern on the second wafer.

19. The method of claim 18, wherein adjusting the one or more patterning processes further comprises adjusting photolithography parameters for patterning the second pattern on the second wafer.

20. The method of claim 18, further comprising:
calculating a fourth DoMa map measuring critical dimensions of the second pattern on the second wafer; and
updating the bias map using the fourth DoMa map.

* * * * *